United States Patent
Edgren et al.

(10) Patent No.: US 10,389,397 B2
(45) Date of Patent: Aug. 20, 2019

(54) SMALL FORM-FACTOR PLUGGABLE (SFP) TRANSCEIVERS

(71) Applicant: Laird Technologies, Inc., Earth City, MO (US)

(72) Inventors: Björn Edgren, Vallentuna (SE); Karl Göran Olof Ihrefjord, Taby (SE); Matthew Tapping, High Wycombe (GB); Michael Scott Poulsen, House Springs, MO (US); Jason L. Strader, Cleveland, OH (US); Eugene Anthony Pruss, Avon Lake, OH (US)

(73) Assignee: LAIRD TECHNOLOGIES, INC., Chesterfield, MO (US)

( * ) Notice: Subject to any disclaimer, the term of this patent is extended or adjusted under 35 U.S.C. 154(b) by 39 days.

(21) Appl. No.: 15/657,966

(22) Filed: Jul. 24, 2017

(65) Prior Publication Data

US 2018/0034492 A1    Feb. 1, 2018

Related U.S. Application Data

(60) Provisional application No. 62/367,021, filed on Jul. 26, 2016.

(51) Int. Cl.
*H04B 1/38*    (2015.01)
*H05K 7/20*    (2006.01)
(Continued)

(52) U.S. Cl.
CPC ............. *H04B 1/38* (2013.01); *F25B 21/02* (2013.01); *G02B 6/4269* (2013.01);
(Continued)

(58) Field of Classification Search
CPC ............. F25B 21/02; F25B 2321/0251; F25B 2321/023; G02B 6/4269; H05K 7/20418;
(Continued)

(56) References Cited

U.S. PATENT DOCUMENTS 4,934,965 A * 6/1990 Buddrus .............. H01R 13/113
                                                 439/845
6,097,598 A    8/2000 Miyahara et al.
(Continued)

FOREIGN PATENT DOCUMENTS

CN    201976133 U    9/2011
CN    103797903 B    1/2016
(Continued)

OTHER PUBLICATIONS

European Search Report dated Nov. 2, 2017 for European application No. 17183352 filed Jul. 26, 2017 which claims priority to the instant application; 9 pages.
(Continued)

*Primary Examiner* — Tulsidas C Patel
*Assistant Examiner* — Travis S Chambers
(74) *Attorney, Agent, or Firm* — Harness, Dickey & Pierce, P.L.C.; Anthony G. Fussner

(57) ABSTRACT

In an exemplary embodiment, a device generally includes a housing, an external heat sink, and at least one of a thermal interface material and a thermoelectric module generally between a side of the housing and the external heat sink. At least one spring contact is coupled to the side of the housing generally between the connector and the at least one of a thermal interface material and a thermoelectric module. The at least one spring contact and the at least one of a thermal interface material and a thermoelectric module define at least a portion of a thermally-conductive heat path between the housing and the external heat sink. Graphite is wrapped around the at least one spring contact and/or a thermally-conductive and electrically-conductive material is wrapped around at least a portion of the thermal interface material.

23 Claims, 9 Drawing Sheets

(51) Int. Cl.
  *H05K 5/02* (2006.01)
  *H01R 13/24* (2006.01)
  *F25B 21/02* (2006.01)
  *H01R 13/6591* (2011.01)
  *H04B 1/036* (2006.01)
  *G02B 6/42* (2006.01)

(52) U.S. Cl.
  CPC ..... *H01R 13/2457* (2013.01); *H01R 13/6591* (2013.01); *H04B 1/036* (2013.01); *H05K 5/0247* (2013.01); *H05K 7/20418* (2013.01); *F25B 2321/023* (2013.01); *F25B 2321/0251* (2013.01)

(58) Field of Classification Search
  CPC ...... H05K 5/0247; H05K 1/0201; H04B 1/38; H04B 1/036; H01R 13/6591; H01R 13/2457
  USPC .................................. 439/487, 485
  See application file for complete search history.

(56) References Cited

U.S. PATENT DOCUMENTS

| | | | |
|---|---|---|---|
| 6,309,742 B1 | 10/2001 | Clupper et al. | |
| 6,410,137 B1 | 6/2002 | Bunyan | |
| 6,521,348 B2 | 2/2003 | Bunyan et al. | |
| 6,784,363 B2 | 8/2004 | Jones | |
| 6,821,030 B2 | 11/2004 | Fukuda et al. | |
| 6,835,453 B2 | 12/2004 | Greenwood et al. | |
| 7,131,859 B1 * | 11/2006 | Zumbrunnen | G02B 6/4201 439/487 |
| 7,135,643 B2 | 11/2006 | van Haaster et al. | |
| 7,161,809 B2 | 1/2007 | Ford et al. | |
| 7,292,441 B2 | 11/2007 | Smalc et al. | |
| 7,317,742 B2 | 1/2008 | Saito et al. | |
| 7,326,862 B2 | 2/2008 | Lionetta et al. | |
| 7,355,857 B2 | 4/2008 | Pirillis et al. | |
| 7,852,633 B2 * | 12/2010 | Ito | H05K 5/0286 165/80.3 |
| 7,889,502 B1 | 2/2011 | Reis et al. | |
| 7,974,098 B2 | 7/2011 | Oki et al. | |
| 8,599,559 B1 * | 12/2013 | Morrison | H05K 9/0058 361/702 |
| 8,758,892 B2 | 6/2014 | Bergin et al. | |
| 8,885,342 B2 * | 11/2014 | Skepnek | H01L 23/367 174/548 |
| 9,052,483 B2 | 6/2015 | Nguyen | |
| 9,255,703 B2 | 2/2016 | Auyeung et al. | |
| 9,368,887 B2 | 6/2016 | Ekstedt et al. | |
| 9,869,837 B2 * | 1/2018 | Morgan | G06F 1/181 |
| 2006/0128221 A1 | 6/2006 | Yoshikawa et al. | |
| 2006/0180348 A1 | 8/2006 | Cloutier et al. | |
| 2007/0052125 A1 | 3/2007 | Kalinoski et al. | |
| 2008/0150747 A1 * | 6/2008 | Eren | G06K 19/0723 340/2.1 |
| 2010/0027220 A1 | 2/2010 | Hughes et al. | |
| 2010/0039775 A1 | 2/2010 | Lima | |
| 2010/0178783 A1 | 7/2010 | Bright et al. | |
| 2012/0033384 A1 | 2/2012 | Pillai | |
| 2012/0061135 A1 * | 3/2012 | Hill | H05K 9/009 174/388 |
| 2013/0048262 A1 | 2/2013 | Ofoma et al. | |
| 2014/0332193 A1 | 11/2014 | Oh et al. | |
| 2015/0296638 A1 | 10/2015 | Wu et al. | |
| 2015/0359134 A1 | 12/2015 | Soong et al. | |

FOREIGN PATENT DOCUMENTS

| | | |
|---|---|---|
| EP | 1680274 A2 | 7/2006 |
| JP | 2007184392 A | 7/2007 |
| KR | 2009028283 | 3/2009 |
| KR | 10-1228603 | 1/2013 |
| KR | 10-1245164 B1 | 3/2013 |

OTHER PUBLICATIONS

Williams, Jim; A Thermoelectric Cooler Temperature Controller for Fiber Optic Lasers, Application Note 89, Apr. 2001, 11 pages.
Tgon™ 9000, High Thermal Conductive Graphite Sheet Preliminary, www.lairdtech.com/thermal, Copyright 2014, 2 pages.

\* cited by examiner

US 10,389,397 B2

SMALL FORM-FACTOR PLUGGABLE (SFP) TRANSCEIVERS

CROSS-REFERENCE TO RELATED APPLICATION

This application claims the benefit of U.S. Provisional Application No. 62/367,021 filed Jul. 26, 2016. The entire disclosure of the above application is incorporated herein by reference.

FIELD

The present disclosure generally relates to thermal management for devices, such as transceivers (e.g., small form-factor pluggable (SFP) transceivers, SFP+ transceivers, quad small form-factor pluggable (QSFP) transceiver, QSFP+ transceivers, XFP transceivers, etc.), other devices, etc.

BACKGROUND

This section provides background information related to the present disclosure which is not necessarily prior art.

Small form-factor pluggable (SFP) transceivers may be compact, hot-pluggable transceivers used for telecommunications, data communications applications, etc. A SFP transceiver may interface a network device motherboard (e.g., for a switch, router, media converter, etc.) to a fiber optic or copper networking cable. SFP transceivers may support communications standards including SONET, gigabit Ethernet, Fibre Channel, etc. As used herein, small form-factor pluggable (SFP) also include other small-form factor pluggables, such as SFP+, quad small form-factor pluggable (QSFP), QSFP+, etc.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

SUMMARY

This section provides a general summary of the disclosure, and is not a comprehensive disclosure of its full scope or all of its features.

In an exemplary embodiment, a device generally includes a housing, an external heat sink, and at least one of a thermal interface material and a thermoelectric module generally between a side of the housing and the external heat sink. At least one spring contact is coupled to the side of the housing generally between the connector and the at least one of a thermal interface material and a thermoelectric module. The at least one spring contact and the at least one of a thermal interface material and a thermoelectric module define at least a portion of a thermally-conductive heat path between the housing and the external heat sink. Graphite is wrapped around the at least one spring contact and/or a thermally-conductive and electrically-conductive material is wrapped around at least a portion of the thermal interface material.

Further areas of applicability will become apparent from the description provided herein. The description and specific examples in this summary are intended for purposes of illustration only and are not intended to limit the scope of the present disclosure.

DETAILED DESCRIPTION

Example embodiments will now be described more fully with reference to the accompanying drawings.

The inventors herein have recognized that the demand for increasing numbers of connected devices with increasing speed expectations, combined with physically smaller base stations, may result in higher base station temperatures. Small form-factor pluggable (e.g., SFP, SFP+, QSFP, QSFP+, etc.) connections may be designed to shut down above a temperature of eighty-five degree Celsius. When a shut-down occurs, users may get frustrated from losing the connection on their mobile phones, computers, etc. It is also a health risk where medical equipment such as personal alarms, etc. are transferred from cable connections to wireless connections.

The inventors have also recognized SFP connections may generate up to two Watts or more of heat dissipation. In some applications, SFP ports may be stacked and ganged in high numbers, thereby generating large amounts of combined heat.

The inventors have developed, as described further below, example SFP transceivers that may provide one or more (or none) of the following advantages: increased cooling with increased reliability (e.g., increased reliability even after numerous connects and disconnects of cable connectors to the SFP transceiver, etc.), increased heat transfer, modularity and flexibility, allowance for use of thermoelectric modules (TEMs) and/or thermal interface materials (TIMs), allowance for different materials to meet different height requirements, length requirements, thermal conductivity requirements, passive or active applications, ability to cool a cable connector as well as the SFP cage, etc.

Figure 1:
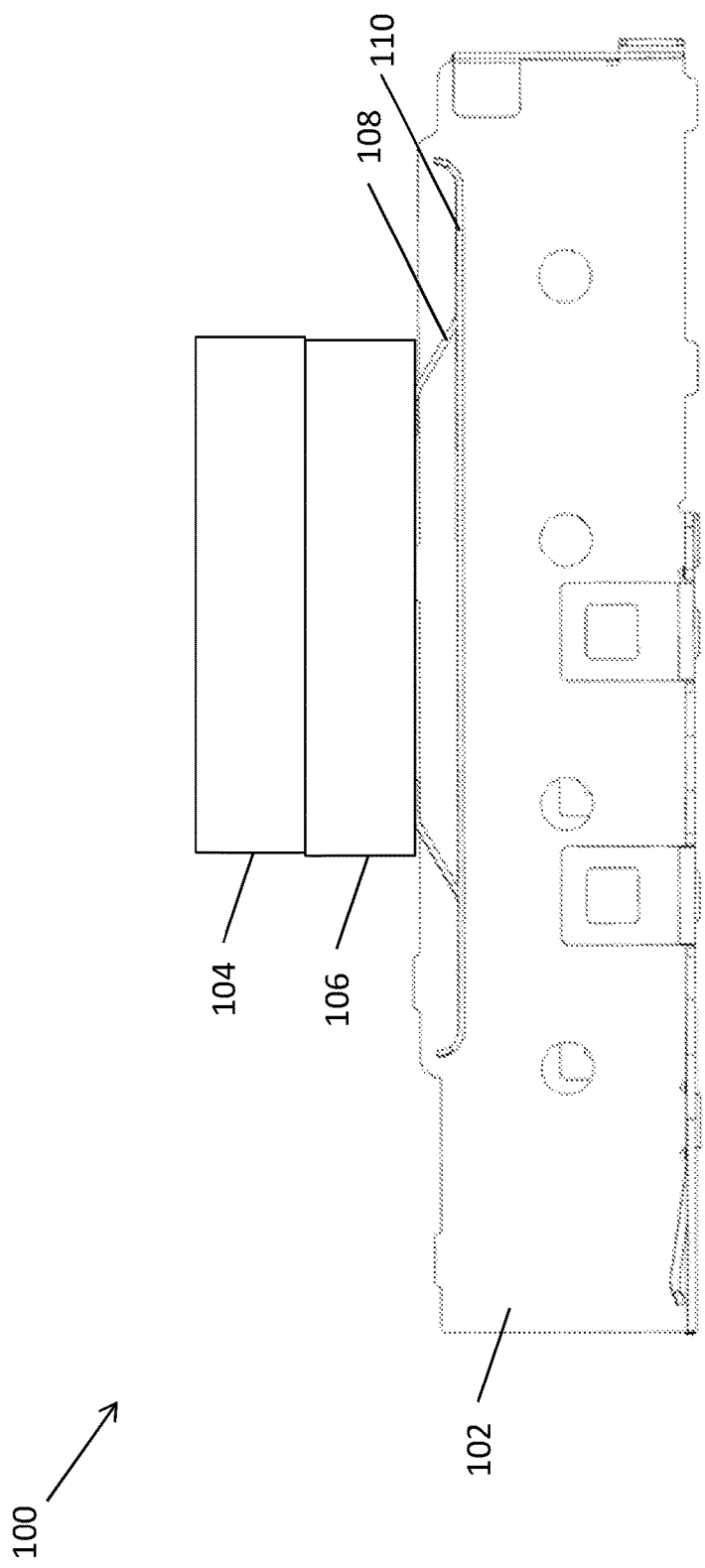
FIG. 1 is a cross-sectional side view of a small form-factor pluggable (SFP) transceiver according to an exemplary embodiment.

With reference now to the figures, FIG. 1 illustrates an exemplary embodiment of a small form-factor pluggable (SFP) transceiver 100 (broadly, a device) including a small form-factor pluggable cage 102 (broadly, a housing). The cage 102 is adapted to receive a small form-factor pluggable cable connector (broadly, a connector). The SFP transceiver 100 also includes an external heat sink 104. A thermal interface material (TIM) 106 is positioned generally between (e.g., coupled in thermal contact with, etc.) a top side or other side of the cage 102 and the external heat sink 104. The TIM 106 may be used to transfer heat from the cage 102 to the external heat sink 104.

The SFP transceiver 100 also includes spring contacts 108 coupled to the top side of the cage 102 generally between the cable connector and the TIM 106. The spring contacts 108 may be configured to contact a cable connector received in the cage 102 to define, provide, establish, or create at least a portion of a thermally-conductive heat path between the cable connector and the top side of the cage 102 to thereby increase heat transfer from the cable connector to the top side of the cage 102.

The cage 102 may be any suitable cage capable of receiving an SFP cable connector. The cage 102 may have dimensions corresponding to an SFP connector to allow insertion of the SFP cable connector into the cage 102. The cage 102 may receive the cable connector via any suitable releaseably coupled engagement, including but not limited to a friction fit, a snap fit, etc. The cage 102 may include an interface for transmitting and/or receiving signals via the SFP connector, such as an optical cable interface, an electrical cable interface, etc. The interface may allow for communication to and/or from the cable connector to a motherboard, printed circuit board (PCB), network card, etc. to which the cage 102 is mounted.

The cage 102 may comprise any suitable material, including metal, etc. For example, the cage 102 may comprise a material suitable for shielding against noise generated by the transfer of data through the cable connector (e.g., electromagnetic interference (EMI) shielding, etc.). Alternative embodiments may include other devices, such as other transceivers (e.g., SFP+ transceivers, XFP transceivers, QSFP transceivers, QSFP+ transceiver, etc.) devices having housings or cages configured for use with other connectors besides SFP cable connectors, etc. Accordingly, aspects of the present disclosure should not be limited to SFP transceivers and SFP cable connectors.

The heat sink 104 is adapted to transfer heat away from the cage 102 and a cable connector received inside the cage 102, to reduce a temperature of the cage 102 and the cable connector, maintain a temperature of the cage 102 and the cable connector below a specified threshold, etc. The heat sink 104 may include any suitable heat sink material, configurations, etc. suitable to reduce the temperature of the cage 102 and cable connector. For example, the heat sink materials and configuration may be selected such that the heat sink 104 is capable of dissipating heat at a rate sufficient to maintain the temperature of the cage 102 and the cable connector below a specified threshold temperature at which operation of the cable connector would otherwise be impaired. Transfer of heat to the heat sink 104 may reduce the amount of heat that is transferred from the cable connector to a board of the SFP transceiver 100, thereby reducing the amount of heat that could dissipate further from the board to more sensitive components.

The thermal interface material 106 may include any suitable material (e.g., gap filler, etc.) for increasing heat transfer from a top of the cage (e.g., from a spring contact 108 defining a portion of the top of the cage) to the heat sink 104. The thermal interface material 106 may provide increased thermal conductivity over air gaps, as the thermal interface material 106 may fill in gaps between surfaces that would otherwise be separated by air. Accordingly, the thermal interface material 106 may have a higher thermal conductivity than air.

The thermal interface material 106 may be coupled between the top side of the cage 102 and the heat sink 104 to transfer heat from the cage 102 to the heat sink 104. In some embodiments, the thermal interface material 106 may include one or more thermoelectric modules. For example, a thermoelectric module may be coupled between the top side of the cage 102 and the heat sink 104 to transfer heat from the cage 102 (e.g., a connector received in the cage, a spring contact 108 in contact with a connector, etc.) to the heat sink 104. For example, the thermal interface material 106 may be coupled between a thermoelectric module and the cage 102, between the thermoelectric module and the heat sink 104, etc., to increase thermal conductivity from the cage 102 to thermoelectric module and/or the heat sink 104.

A thermoelectric module may be any suitable module capable of transferring heat between opposing sides of the module when a voltage is applied to the module. The thermoelectric module may have a cold side oriented towards the cage 102 and a hot side oriented towards the heat sink 104. The cold side of the thermoelectric module may be in direct contact with the top side of the cage 102, may contact the top side of the cage 102 via a thermal interface material, etc. Similarly, the hot side of the thermoelectric module may be in direct contact with the heat sink 104, may contact the heat sink 104 via thermal interface material 106, etc.

As shown in FIG. 1, spring contacts 108 are coupled to the top side of the cage 102 and may be configured to contact a cable connector (not shown) received in the cage 102. The spring contacts 108 help create a thermally-conductive heat path between the cable connector and the top side of the cage 102 (e.g., a thermally-conductive heat path from the connector to the thermal interface material 106, etc.) to increase heat transfer from the cable connector to the top side of the cage 102. For example, the spring contacts 108 may provide mechanical or spring pressure between the cable connector and the cage 102, the thermal interface material 106, etc., thus improving the thermal contact between the cable connector and the cage 102, the thermal interface material 106, etc.

The spring contacts 108 may comprise any suitable thermally-conductive material capable of transferring heat from the cable connector to the top of the cage 102, including stainless steel, etc. The spring contacts 108 may comprise a sufficiently rigid material to maintain at least some mechanical pressure between the cable connector and the top of the cage 102. In some embodiments, the spring contacts 108 comprise a metallic thermally-conductive material.

The spring contacts 108 may be coupled to the cage 102 using any suitable connections. In some embodiments, the spring contacts 108 may be coupled to the cage 102 via laser welding, via rivets, via glue, etc.

The spring contacts 108 may be dimensioned to apply mechanical pressure between a connector received in the cage 102 and a top side of the cage 102, the thermal interface material 106, etc. For example, the spring contacts 108 may have a height corresponding to a distance between a cable connector and a top of the cage 102 when the cable connector is inserted into the cage 102, may have a height that is slightly larger than a distance between a cable connector and a top of the cage 102 when the cable connector is inserted into the cage 102 such that the cable connector slightly deforms the spring contacts 108 when inserted into the cage 102, etc. Accordingly, the spring contacts 108 may comprise a material that is compressible, deformable, etc. to apply mechanical pressure to the cable connector.

The spring contacts 108 may be coupled to a metal plate 110 (broadly, electrically-conductive support). The metal plate 110 may increase a surface area in contact with the cable connector when the cable connector is received in the cage 102, thereby increasing the thermal conductivity from the cable connector, through the spring contacts 108 to the top of the cage. In some embodiments, the top side of the cage 102 may include an opening in which the metal plate 110 is positioned such that the metal plate 110 and/or the spring contacts 108 define at least a portion of the top side of the cage 102.

The metal plate 110 may comprise any thermally-conductive material suitable for transferring heat from the cable connector to the spring contacts 108. The metal plate 110 may be adapted to increase the mechanical pressure, surface area of thermal contact, etc. applied to the cable connector when the cable connector is received in the cage 102.

Figure 2:
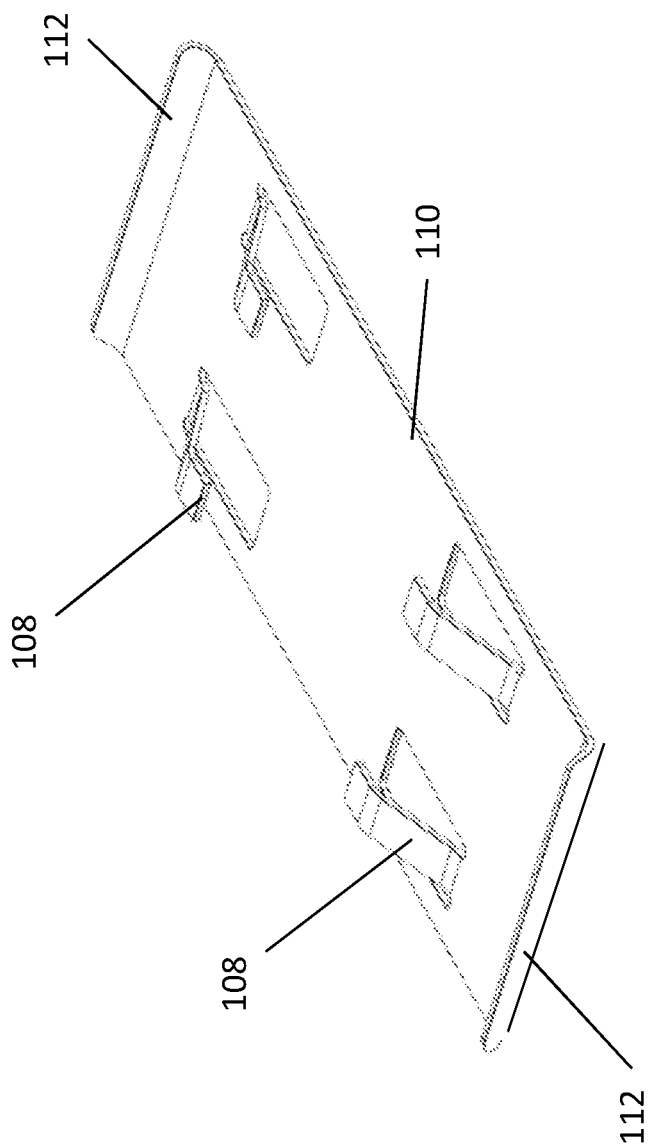
FIG. 2 is a perspective view of the spring contacts and metal plate of the SFP transceiver shown in FIG. 1.

FIG. 2 illustrates an example metal plate 110 with spring contacts 108. As shown in FIG. 2, the metal plate 110 may be integrally formed with the spring contacts 108. For example, a piece of metal may be cut to form the spring contact portions. The spring contacts 108 may then be defined by bending cut spring contact portions upwards from the metal plate 110. In other embodiments, spring contacts 108 may be coupled to the metal plate 110, adhered to the metal plate 110, etc.

The metal plate 110 may include rounded ends 112. The rounded ends 112 may be adapted to allow a cable connector to be inserted against the bottom side of the metal plate 110 without catching on ends of the metal plate 110. For example, the rounded ends 112 may allow the connector to slide past and under edges of the metal plate 110 when the cable connector is inserted into the cage 102. The rounded ends may be formed using any suitable technique, including bending of the metal plate 110, etc.

Although FIG. 2 illustrates four spring contacts 108, it should be apparent that other embodiments may include any suitable number of spring contacts, including but not limited to a single spring contact, three spring contacts, four spring contacts, more than four spring contacts, etc. Similarly, although FIG. 2 illustrates the metal plate 110 as having a rectangular shape, it should be apparent that other embodiments may include any other suitable shapes for the metal plate 110, including circular metal plates, square metal plates, etc.

Figure 3:
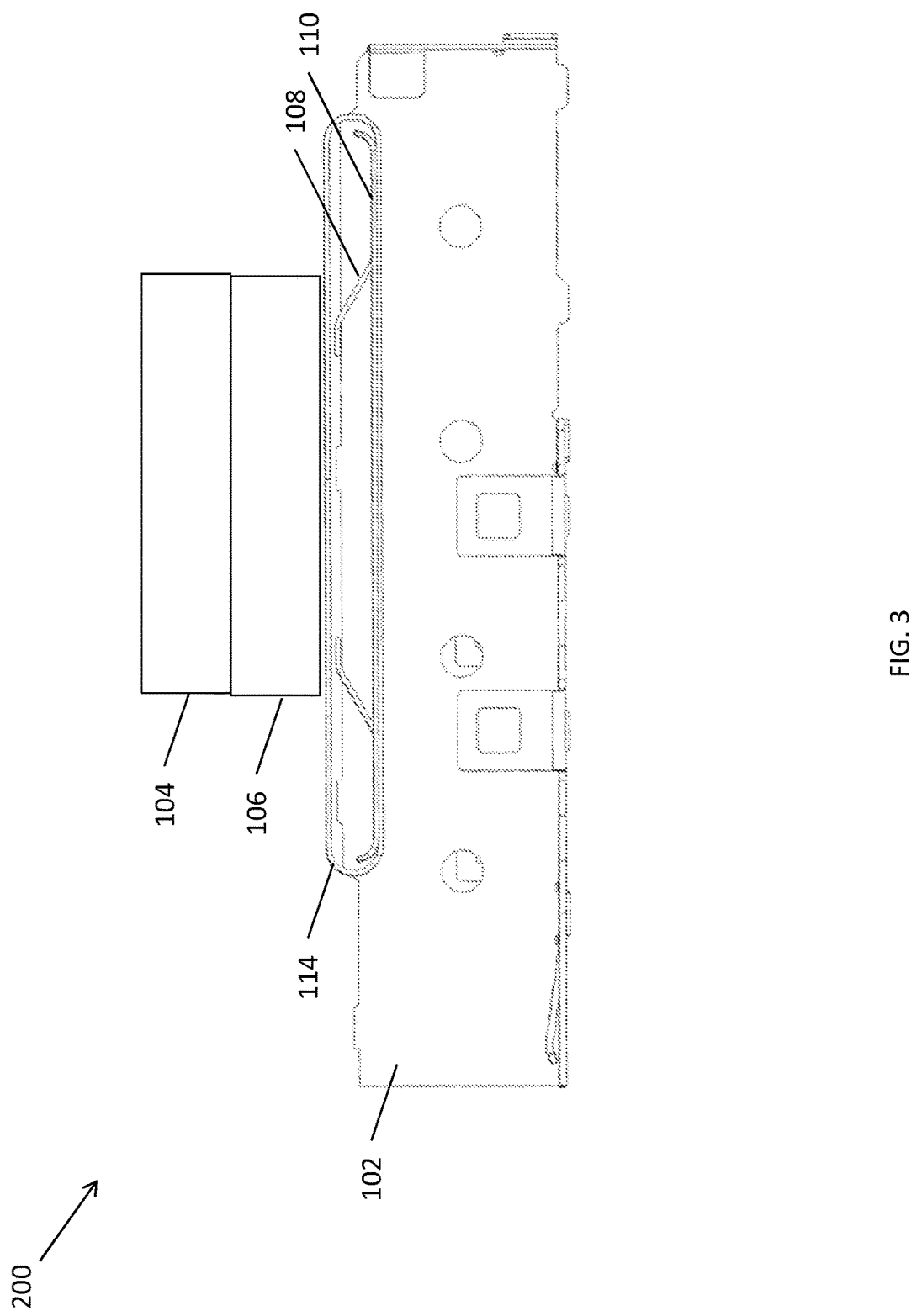
FIG. 3 is a cross-sectional side view of the SFP transceiver shown in FIG. 1, and further illustrating a graphite sheet wrapped around the spring contacts and metal plate according to an exemplary embodiment.

FIG. 3 illustrates an exemplary embodiment of a small form-factor pluggable (SFP) transceiver 200, which is similar to the SFP transceiver 100 of FIG. 1, but includes a graphite sheet 114 wrapped around at least a portion of the spring contacts 108. Similar to the SFP transceiver 100 of FIG. 1, the SFP transceiver 200 illustrated in FIG. 2 includes a small form-factor pluggable cage 102. The cage 102 is adapted to receive a small form-factor pluggable cable connector (not shown). The SFP transceiver 200 also includes an external heat sink 104. A thermal interface material (TIM) and/or thermoelectric module (TEM) 106 is coupled between a top side of the cage 102 and the external heat sink 104 to transfer heat from the cage 102 to the external heat sink 104.

The SFP transceiver 200 also includes spring contacts 108 coupled to the top side of the cage 102. The spring contacts 108 are adapted to contact a cable connector received in the cage 102 to create a thermally-conductive heat path between the cable connector and the top side of the cage 102 to increase heat transfer from the cable connector to the top side of the cage 102.

As shown in FIG. 3, a graphite sheet 114 is wrapped around at least a portion of the spring contacts 108 and metal plate 110. The graphite sheet 114 is adapted to increase thermal conductivity between a cable connector received in the cage 102 and a top side of the cage 102. In some embodiments, the top side of the cage 102 may include an opening with the graphite sheet 114 positioned within the opening to thereby define a portion of the top side of the cage 102. Accordingly, the graphite sheet 114 may contact the thermal interface material 106 to transfer heat from a cable connector to the thermal interface material 106.

Any suitable graphite material may be used that is capable of wrapping around at least a portion of the spring contacts 108, the metal plate 110, etc. For example, the graphite sheet 114 may have a very high thermal conductivity and may conduct heat well from the cable connector to the top of the cage 102.

Figure 4:
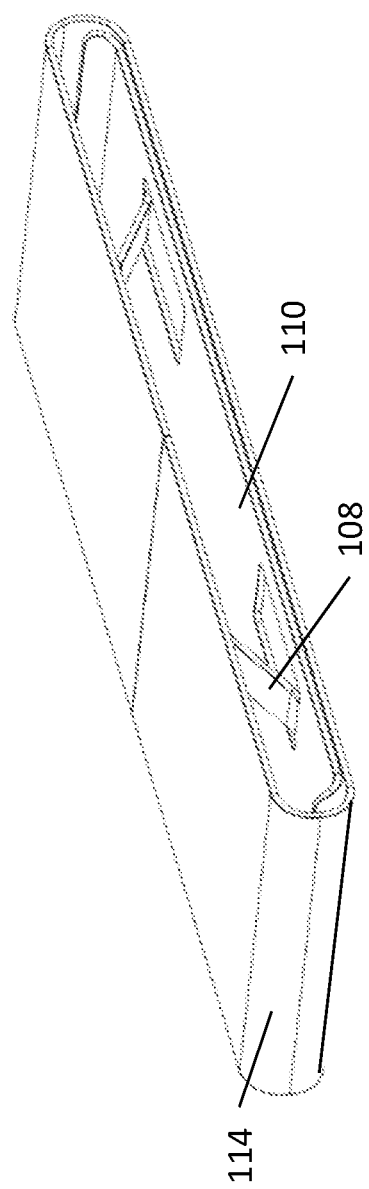
FIG. 4 is a perspective view of the graphite sheet shown in FIG. 3 wrapped around the spring contacts and metal plate.

FIG. 4 illustrates the spring contacts 108, metal plate 110 and graphite sheet 112 of FIG. 3. As shown in FIG. 4, the graphite sheet 114 may be wrapped around at least a portion of the spring contacts 108 and the metal plate 110. The graphite sheet 114 is illustrated as wrapped around the metal plate 110 in a direction parallel to the length of the metal plate. As should be apparent, other embodiments may include one or more graphite sheets wrapped in other direction(s) about the spring contacts 108 and/or metal plate 110.

In some embodiments, the graphite sheet 114 may be synthetic. The graphite sheet 114 may include a polyethylene terephthalate (PET) layer for increased mechanical and/or abrasion resistance, and may include an adhesive material for fixing the graphite sheet 114 to a surface, for connecting the graphite sheet 114 to a surface, etc. In an exemplary embodiment, the graphite sheet 114 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet.

In some embodiments, the graphite sheet 114 may comprise a label having indicia indicative of properties of the SFP transceiver 200. Using a graphite label for the SFP transceiver 200 may increase thermal conductivity from the cable connector to a heat sink, etc., while also providing information about properties of the SFP transceiver 200.

Figure 5:
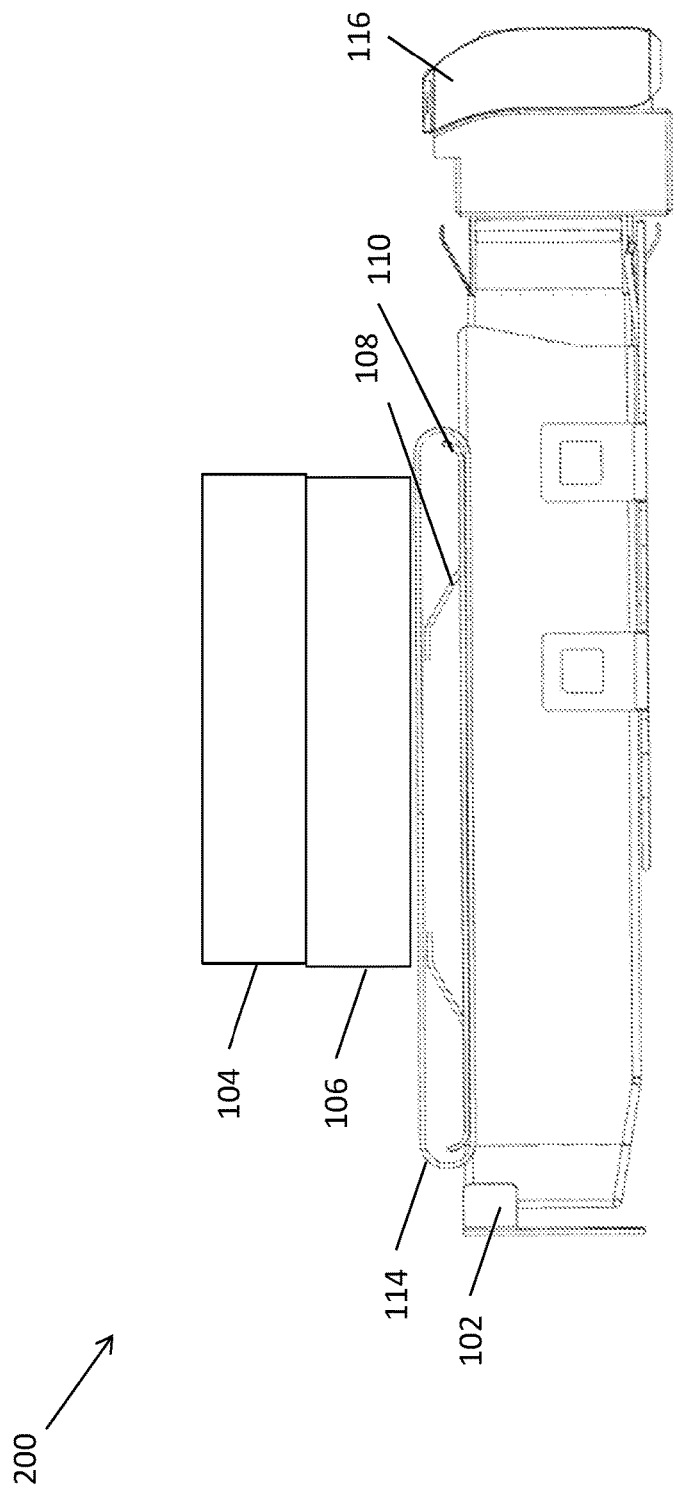
FIG. 5 is a cross-sectional side view of the SFP transceiver shown in FIG. 3, and further illustrating a cable connector received in the SFP transceiver.

FIG. 5 illustrates the SFP transceiver 200 of FIG. 3, with a cable connector 116 received in the cage 102. As shown in FIG. 5, the cable connector 116 contacts the graphite sheet 114 on the bottom surface of the metal plate 110 when the cable connector 116 is received in the cage 102.

As described above, the spring contacts 108 and metal plate 110 wrapped by the graphite sheet 114 increase thermal conductivity from the cable connector to the top of the cage 102, where heat from the cable connector 116 may be dissipated by the heat sink 104 via thermal interface material 106, which may include one or more thermoelectric modules.

In some embodiments, a thermally-conductive and electrically-conductive material may be wrapped around at least a portion of the TIM 106. Accordingly, the TIM 106 and material wrapped around the TIM 106 may provide a thermally and electrically conductive path between the SFP transceiver cage 102 and a heat sink, other materials, etc.

This may increase heat transfer away from a cable connector received in the cage 102 and electrically ground the cage 102.

Figure 6:
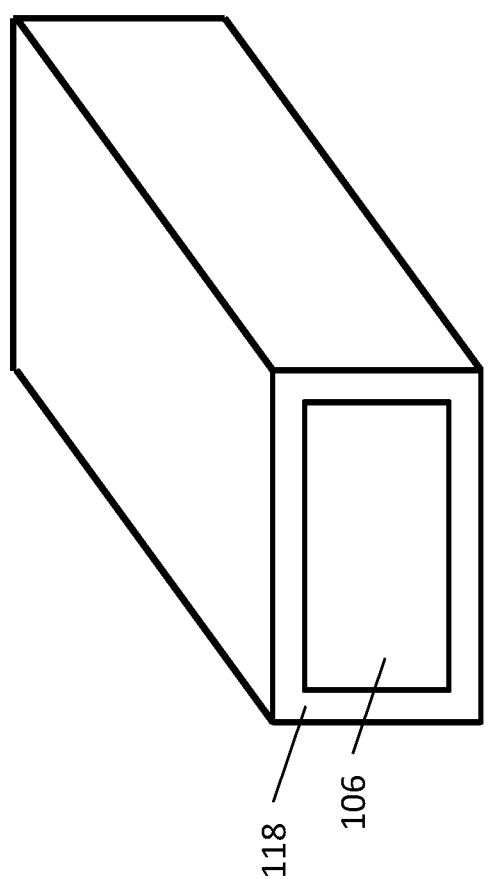
FIG. 6 is a perspective view of an example thermally-conductive and electrically-conductive material wrapped around the thermal interface material shown in FIG. 1.

FIG. 6 illustrates an example TIM 106 and a thermally-conductive and electrically-conductive material 118 wrapped around the TIM 106. Although FIG. 6 illustrates the thermally-conductive/electrically-conductive material 118 wrapped around a top, bottom, and sides of the TIM 106, it should be apparent that other embodiments may include thermally-conductive/electrically-conductive material 118 wrapped around other parts of the TIM 106 (e.g., ends of the TIM 106, etc.).

The TIM 106 may include any material suitable for conducting heat from the cage 102 to an external heat sink, etc. Example thermal interface materials that may be used in exemplary embodiments include thermal gap fillers, thermal phase change materials, thermally-conductive EMI absorbers or hybrid thermal/EMI absorbers, thermal putties, thermal pads, etc. The TIM 106 may be compressible between the cage 102 and a heat sink. For example, in some embodiments, the TIM 106 may comprise a fabric-over-foam material, such that the TIM 106 may provide both a thermal interface material and an electrically and thermally-conductive fabric wrapped around at least a portion of the thermal interface material. The fabric-over-foam may be wrapped with metal (e.g., copper, foil, etc.).

In some embodiments, the TIM 106 may include a silicone elastomer. The silicone elastomer may be filled with a suitable thermally-conductive material, including ceramic, boron nitride, etc. The silicone elastomer may be treated to allow the thermally-conductive and electrically-conductive material 118 to adhere to the silicone elastomer. For example, the TIM 106 may include a thermal interface material from Laird Technologies, such as any one or more of the Tputty™ 502 series thermal gap fillers, Tflex™ series gap fillers (e.g., Tflex™ 300 series thermal gap filler materials, Tflex™ 600 series thermal gap filler materials, Tflex™ 700 series thermal gap filler materials, etc.), Tpcm™ series thermal phase change materials (e.g., Tpcm™ 580 series phase change materials, Tpcm™ 780 series phase change materials, Tpcm™ 900 series phase change materials etc.), Tpli™ series gap fillers (e.g., Tpli™ 200 series gap fillers, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), etc. In some exemplary embodiments, the TIM 106 may comprise a compliant gap filler having high thermal conductivity. By way of example, the TIM 106 may comprise a thermal interface material of Laird, such as one or more of Tflex™ 200, Tflex™ HR200, Tflex™ 300, Tflex™ 300TG, Tflex™ HR400, Tflex™ 500, Tflex™ 600, Tflex™ HR600, Tflex™ SF600, Tflex™ 700, Tflex™ SF800 thermal gap fillers.

The TIM 106 may comprise an elastomer and/or ceramic particles, metal particles, ferrite EMI/RFI absorbing particles, metal or fiberglass meshes in a base of rubber, gel, or wax, etc. The TIM 106 may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermally-conductive additives, etc. The TIM 106 may be configured to have sufficient conformability, compliability, and/or softness (e.g., without having to undergo a phase change or reflow, etc.) to adjust for tolerance or gaps by deflecting at low temperatures (e.g., room temperature of 20° C. to 25° C., etc.) and/or to allow the thermal interface materials to closely conform (e.g., in a relatively close fitting and encapsulating manner, etc.) to a mating surface when placed in contact with (e.g., compressed against, etc.) the mating surface, including a non-flat, curved, or uneven mating surface.

The TIM 106 may include a soft thermal interface material formed from elastomer and at least one thermally-conductive metal, boron nitride, and/or ceramic filler, such that the soft thermal interface material is conformable even without undergoing a phase change or reflow. In some exemplary embodiments, the TIM 106 may include ceramic filled silicone elastomer, boron nitride filled silicone elastomer, or a thermal phase change material that includes a generally non-reinforced film.

Exemplary embodiments may include one or more thermal interface materials having a high thermal conductivity (e.g., 1 W/mK (watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, etc.) depending on the particular materials used to make the thermal interface material and loading percentage of the thermally conductive filler, if any. These thermal conductivities are only examples as other embodiments may include a thermal interface material with a thermal conductivity higher than 6 W/mK, less than 1 W/mK, or other values between 1 and 6 W/mK. Accordingly, aspects of the present disclosure should not be limited to use with any particular thermal interface material as exemplary embodiments may include a wide range of thermal interface materials.

The thermally-conductive/electrically-conductive material 118 wrapped around the TIM 106 may include any material suitable for conducting heat from cage 102 and electrically grounding the cage 102. In some embodiments, the thermally-conductive/electrically-conductive material 118 may include a foil (e.g., copper foil, etc.), a metallized and/or plated fabric (e.g., nickel-copper plated nylon, etc.), a metalized plastic, a graphite sheet, etc. The thermally-conductive/electrically-conductive material 118 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet.

The thermally and electrically conductive material 118 may have any suitable thickness that allows the material 118 to be wrapped around at least a portion of the TIM 106. For example, in some embodiments the thermally and conductive material may have a thickness of less than about one hundred micrometers (um) (e.g., 17 um, 25 um, 40 um, 70 um, 100 um, etc.). The material may have any suitable thermal conductivity (e.g., about 500 to 1900 W/mK, etc.).

Figure 7:
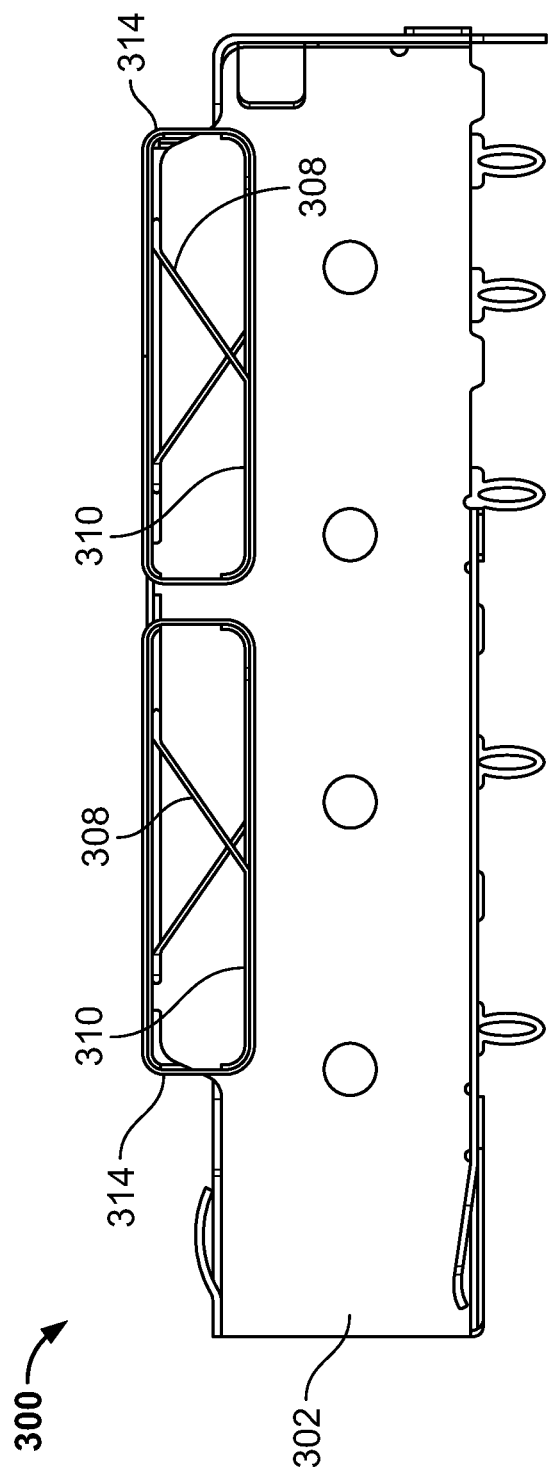
FIG. 7 is a cross-sectional side view of a small form-factor pluggable (SFP) transceiver according to an exemplary embodiment that includes first and second graphite sheets wrapped around respective first and second metal plates and spring contacts.
Figure 8:
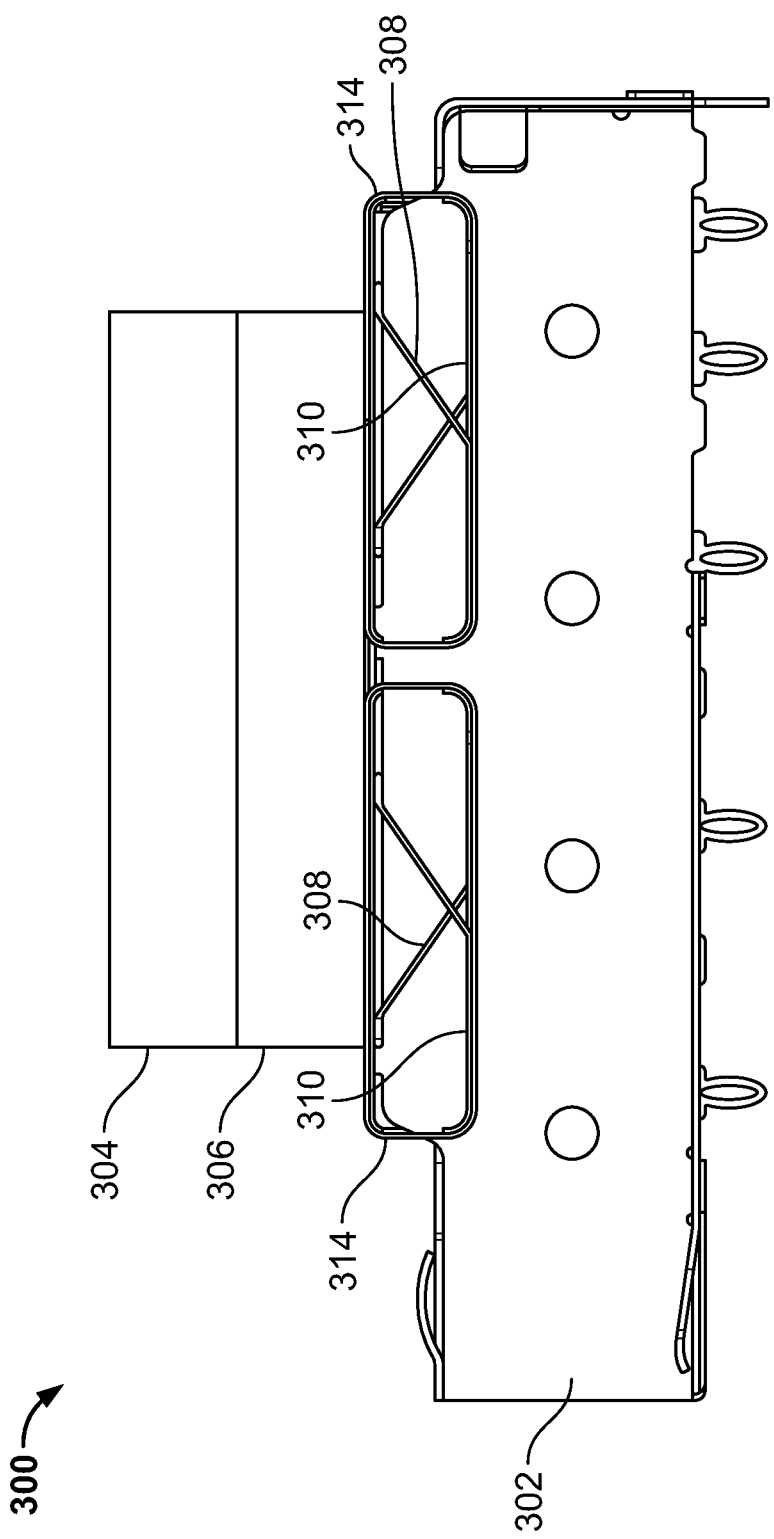
FIG. 8 is a cross-sectional side view of the SFP transceiver shown in FIG. 7, and further illustrating a thermal interface material positioned between the graphite sheets and an external heat sink.
Figure 9:
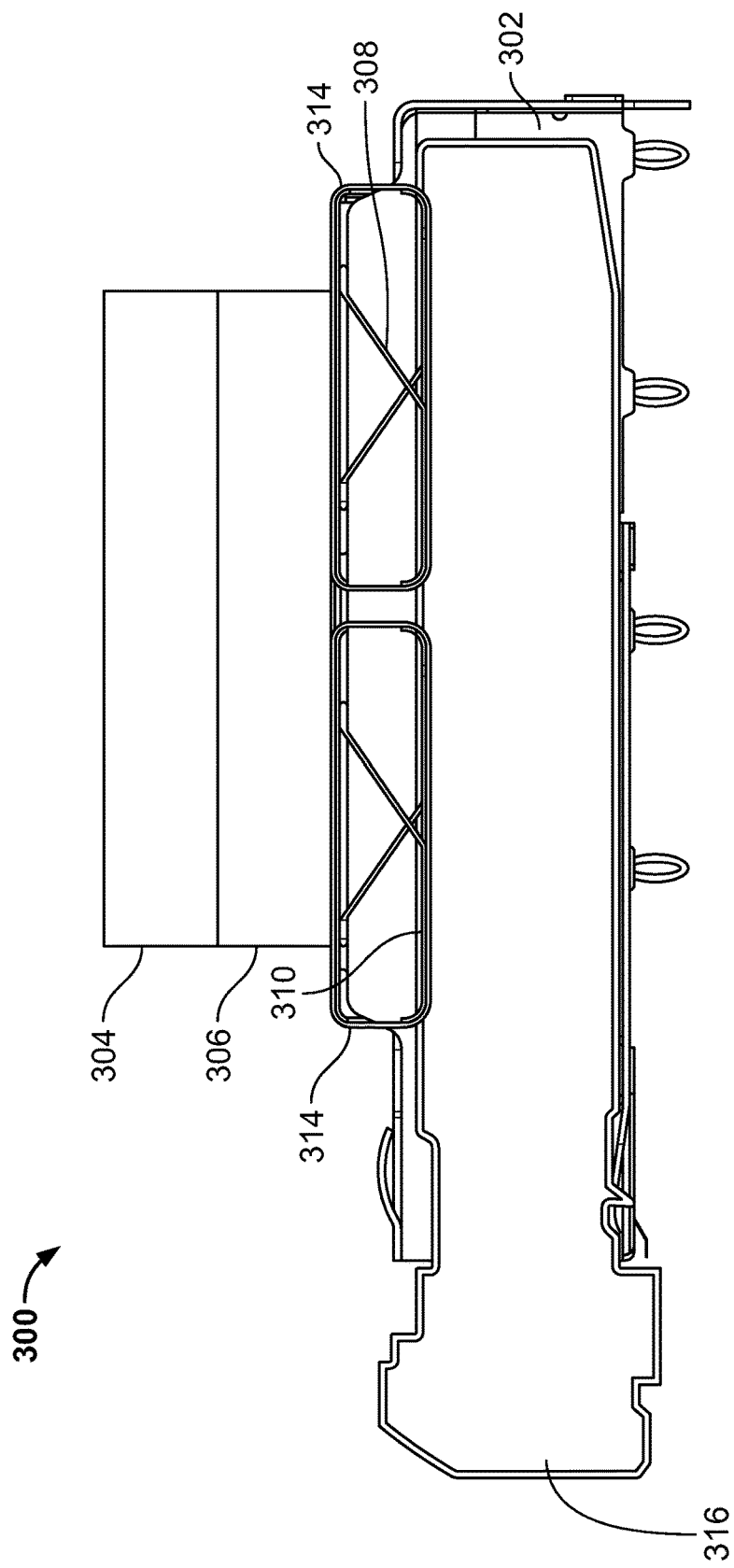
FIG. 9 is a cross-sectional side view of the SFP transceiver shown in FIG. 8, and further illustrating a cable connector received in the cage of the SFP transceiver.

FIGS. 7 through 9 illustrate an exemplary embodiment of a small form-factor pluggable (SFP) transceiver 300. The SFP transceiver 300 may be similar to the SFP transceiver 200 of FIG. 3, but includes multiple graphite sheets 314 wrapped around portions of the spring contacts 308. The graphite sheets 314 form multiple separate loops that increase the cross section for transferring heat and shorten the thermal transfer path.

The SFP transceiver 300 includes a small form-factor pluggable cage 302 adapted to receive a small form-factor pluggable cable connector 316 (FIG. 9). The cage 302 may be any suitable cage capable of receiving an SFP cable connector 316. The cage 302 may have dimensions corresponding to an SFP connector 316 to allow insertion of the SFP cable connector 316 into the cage 302. The cage 302 may receive the cable connector 316 via any suitable releaseably coupled engagement, including but not limited to a friction fit, a snap fit, etc. The cage 302 may include an interface for transmitting and/or receiving signals via the SFP connector 316, such as an optical cable interface, an electrical cable interface, etc. The interface may allow for communication to and/or from the cable connector 316 to a motherboard, printed circuit board (PCB), network card, etc. to which the cage 302 is mounted.

The cage 302 may comprise any suitable material, including metal, etc. For example, the cage 302 may comprise a material suitable for shielding against noise generated by the transfer of data through the cable connector (e.g., electromagnetic interference (EMI) shielding, etc.). Alternative embodiments may include other devices, such as other transceivers (e.g., SFP+ transceivers, XFP transceivers, QSFP transceivers, QSFP+ transceiver, etc.) devices having housings or cages configured for use with other connectors besides SFP cable connectors, etc. Accordingly, aspects of the present disclosure should not be limited to SFP transceivers and SFP cable connectors.

The SFP transceiver 300 also includes spring contacts 308 coupled to the top side of the cage 302, which may be similar or identical to the spring contacts 108 shown in FIGS. 1 through 5. The spring contacts 308 may be configured (e.g., dimensioned, shaped, formed of resilient material, etc.) to provide mechanical or spring pressure for biasing the top and bottom portions of the graphite sheets 314 respectively against and/or in good thermal contact with a thermal interface material 306 (FIGS. 8 and 9) and top of the connector 316, respectively. In turn, this may improve the thermal contact between the top of the connector 316 and the bottom portions of the graphite sheets 314 and between the top portions of the graphite sheets 314 and the thermal interface material 306.

The spring contacts 308 may comprise any suitable thermally-conductive material capable of transferring heat including stainless steel, etc. The spring contacts 308 may comprise a sufficiently rigid material to maintain at least some mechanical pressure between the graphite sheets 314 and the cable connector 316 and thermal interface material 306. In some embodiments, the spring contacts 308 comprise a metallic thermally-conductive material.

The spring contacts 308 may be coupled or attached using any suitable connections. In some embodiments, the spring contacts 308 may be coupled to the cage 302 via laser welding, via rivets, via glue, etc. The spring contacts 308 may be configured (e.g., have a height, etc.) such that the cable connector 316 slightly deforms the spring contacts 308 when inserted into the cage 302, etc. Accordingly, the spring contacts 308 may comprise a material that is compressible, deformable, etc. to apply mechanical pressure to the cable connector.

In this illustrated embodiment, the spring contacts 308 may include multiple (e.g., first and second, etc.) sets or pluralities of spring contacts 308 that are respectively coupled to corresponding ones of multiple (e.g., first and second, etc.) metal plates 310. By way of example, the SFP transceiver 300 may include first and second metal plates 310 having spring contacts 308 similar or identical to the metal plate 110 and spring contacts 108 shown in FIG. 2. Accordingly, the first and second metal plates 310 shown in FIGS. 7 through 9 may also be integrally formed with the spring contacts 308. For example, a piece of metal may be cut to form the spring contact portions. The spring contacts 308 may then be defined by bending cut spring contact portions upwards from the corresponding metal plates 310. In other embodiments, spring contacts 308 may be coupled to the metal plates 310, adhered to the metal plates 310, etc.

The first and second metal plates 310 may include rounded or upwardly curved end portions. The rounded end portions may be adapted to facilitate wrapping of the graphite sheet 314 around the metal plates 310 and/or to allow the cable connector 316 to be inserted along the bottom side of the metal plates 310 without catching on ends of the metal plates 310. For example, the rounded end portions may allow the connector 316 to slide past and under edges of the metal plates 310 and graphite sheets 314 when the cable connector 316 is inserted into the cage 302. The rounded end portions may be formed using any suitable technique, including bending of the metal plates 310, etc.

In some embodiments, the top side of the cage 302 may include one or more openings in which the metal plates 310 are positioned such that the metal plates 310 and/or the spring contacts 308 define at least a portion of the top side of the cage 302.

The metal plates 310 may comprise any thermally-conductive material suitable for transferring heat from the cable connector to the spring contacts 108. The metal plates 310 may be adapted to increase the mechanical pressure, surface area of thermal contact, etc. applied to the cable connector when the cable connector is received in the cage 302.

As shown in FIG. 7, first and second graphite sheets 314 are wrapped around portions of the respective first and second metal plates 310 and spring contacts 308. Accordingly, the first and second graphite sheets 314 form first and second separate loops that help to increase the cross section for transferring heat and shorten the thermal transfer path. The cable connector 316 contacts the graphite sheets 314 along the bottom surfaces of the metal plates 310 when the cable connector 316 is received in the cage 302.

Any suitable graphite material may be used for the graphite sheets 314 that is capable of wrapping around at least a portion of the spring contacts 308, the metal plates 310, etc. For example, the graphite sheets 314 may have a very high thermal conductivity and may conduct heat well from the cable connector 316 to the top of the cage 302.

Each graphite sheet 314 may be wrapped around at least a portion of the spring contacts 308 and the corresponding metal plate 310 in a direction parallel to the length of the metal plate 310 (e.g., FIG. 4, etc.). As should be apparent, other embodiments may include one or more graphite sheets wrapped in other direction(s) about the spring contacts 308 and/or metal plates 310.

In some embodiments, the graphite sheets 314 may be synthetic. The graphite sheets 314 may include a polyethylene terephthalate (PET) layer for increased mechanical and/or abrasion resistance, and may include an adhesive material for fixing the graphite sheets 314 to a surface, for connecting the graphite sheets 314 to a surface, etc. In an exemplary embodiment, one or more of the graphite sheets 314 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet.

In some embodiments, a graphite sheet 314 may comprise a label having indicia indicative of properties of the SFP transceiver 300. Using a graphite label for the SFP transceiver 300 may increase thermal conductivity from the cable connector to a heat sink, etc., while also providing information about properties of the SFP transceiver 300.

The SFP transceiver 300 may also include one or more external heat sinks and one or more thermal interface materials (TIMs). As shown in FIGS. 8 and 9, a thermal interface material (TIM) 306 is positioned generally between (e.g., coupled in thermal contact with, etc.) the graphite sheets 314 and an external heat sink 304. The TIM 306 may be used to more efficiently transfer heat from the graphite sheets 314 to the external heat sink 304. Although FIGS. 8 and 9 show a single TIM 306 positioned atop and extending across both graphite sheets 314, other exemplary embodiments may include first and second TIMs respectively positioned atop the first and second graphite sheets 314. Similarly, FIGS. 8 and 9 also show a single heat sink 304 positioned atop the TIM 306, other embodiments may include first and second heat sinks respectively positioned atop first and second TIMs.

The heat sink 304 is adapted to transfer heat away from the cage 302 and a cable connector 316 received inside the cage 302, to reduce a temperature of the cage 302 and the cable connector 316, maintain a temperature of the cage 302 and the cable connector 316 below a specified threshold, etc. The heat sink 304 may include any suitable heat sink material, configurations, etc. suitable to reduce the temperature of the cage 302 and cable connector 316. For example, the heat sink materials and configuration may be selected such that the heat sink 304 is capable of dissipating heat at a rate sufficient to maintain the temperature of the cage 302 and the cable connector 316 below a specified threshold temperature at which operation of the cable connector 316 would otherwise be impaired. Transfer of heat to the heat sink 304 may reduce the amount of heat that is transferred from the cable connector 316 to a board of the SFP transceiver 300, thereby reducing the amount of heat that could dissipate further from the board to more sensitive components.

The thermal interface material 306 may include any suitable material (e.g., gap filler, silicon elastomer, etc.) for increasing heat transfer to the heat sink 304. The thermal interface material 306 may provide increased thermal conductivity over air gaps, as the thermal interface material 306 may fill in gaps between surfaces that would otherwise be separated by air. Accordingly, the thermal interface material 306 may have a higher thermal conductivity than air.

The thermal interface material 306 may be similar or identical to the example TIM 106 shown in FIG. 6 and described above. Accordingly, the thermal interface material 306 may also include a thermally-conductive and electrically-conductive material wrapped around the TIM 306, such as a foil, (e.g., copper foil, etc.), a metallized and/or plated fabric (e.g., nickel-copper plated nylon, etc.), a metalized plastic, a graphite sheet, etc. The thermally-conductive and electrically-conductive material wrapped around the TIM 306 may comprise a graphite sheet (e.g., Tgon™ 9000 series graphite sheets, etc.) from Laird Technologies, such as a Tgon™ 9017, Tgon™ 9025, Tgon™ 9040, Tgon™ 9070, and/or Tgon™ 9100 synthetic graphite sheet.

In some embodiments, the thermal interface material 306 may be or may include one or more thermoelectric modules. For example, a thermoelectric module may be coupled between the heat sink 304 and the top portions of the graphite sheets 314 to transfer heat from the graphite sheets 314 to the heat sink 304. As another example, a thermal interface material 306 may be coupled between a thermoelectric module and the cage 302, between a thermoelectric module and the heat sink 304, between a thermal electric module and the graphite sheets 314, etc., between the top of the cage 302 and the graphite sheets 314, etc., to increase thermal conductivity along the heat transfer path from the cage 102 to the heat sink 104.

A thermoelectric module may be any suitable module capable of transferring heat between opposing sides of the module when a voltage is applied to the module. The thermoelectric module may have a cold side oriented towards the cage 302 and a hot side oriented towards the heat sink 304. The cold side of the thermoelectric module may be in direct contact with the top side of the cage 302, may be in thermal contact with the top side of the cage 302 via the thermal interface material 306 and/or graphite sheets 314, etc. Similarly, the hot side of the thermoelectric module may be in direct contact with the heat sink 304, may be in thermal contact with the heat sink 304 via the thermal interface material 306 and/or graphite sheets 314, etc.

In an exemplary embodiment, a transceiver (broadly, a device) (e.g., small form-factor pluggable (SFP) transceiver, SFP+ transceiver, quad small form-factor pluggable (QSFP) transceiver, QSFP+ transceiver, XFP transceiver, other devices besides transceivers, etc.) includes a cage (broadly, a housing) (e.g., an SFP cage, etc.) adapted to receive a connector (e.g., an SFP cable connector, other cable connector, etc.). At least one of a thermal interface material and a thermoelectric module is generally between a side (e.g., a top side, another side, etc.) of the cage and an external heat sink. At least one spring contact is coupled to the side of the cage generally between the connector and the at least one of a thermal interface material and a thermoelectric module. The at least one spring contact and the at least one of a thermal interface material and a thermoelectric module define at least a portion of a thermally-conductive heat path between the connector and the external heat sink.

The at least one spring contact may include at least four spring contacts each coupled to the side of the cage generally between the connector and the thermal interface material and/or a thermoelectric module.

The transceiver may further comprise a metal plate coupled to the at least one spring contact. The metal plate may be substantially parallel to the side of the cage and in contact with the connector received in the cage to thereby define a thermally-conductive heat path between the connector and the at least one spring contact. The transceiver may further comprise graphite wrapped generally around at least a portion of the at least one spring contact and the metal plate. The side of the cage may include an opening. The metal plate may be positioned within the opening such that the metal plate and/or the at least one spring contact thereby define at least a portion of the side of the cage.

The transceiver may further comprise a label disposed on the cage. The label may comprise graphite and include indicia related to the transceiver.

The at least one spring contact may be coupled to the top of the cage via a laser weld.

In an exemplary embodiment, the at least one of a thermal interface material and a thermoelectric module is a thermoelectric module.

In another exemplary embodiment, the at least one of a thermal interface material and a thermoelectric module is a thermal interface material. The transceiver may further comprise a thermally-conductive and electrically-conductive material wrapped around at least a portion of the thermal interface material for conducting heat from the cage and for electrically grounding the cage. The thermally-conductive and electrically-conductive material wrapped around at least a portion of the thermal interface material may include at least one of a copper foil, a plated fabric, a nickel-copper plated nylon, a graphite sheet, and a synthetic graphite sheet including a polyethylene terephthalate (PET) layer for increased mechanical and/or abrasion resistance. The thermal interface material may include a ceramic and/or boron nitride filled silicone elastomer. The thermal interface material may include a surface treated such that the thermally-conductive and electrically-conductive material is adherable to silicone elastomer.

In another exemplary embodiment, a transceiver (broadly, a device) (e.g., small form-factor pluggable (SFP) transceiver, SFP+ transceiver, quad small form-factor pluggable (QSFP) transceiver, QSFP+ transceiver, XFP transceiver, other devices besides transceivers, etc.) includes a cage (broadly, a housing) (e.g., a small form-factor pluggable cage, etc.) adapted to receive a connector (e.g., a small form-factor pluggable cable connector, other cable connector, etc.). A thermal interface material is generally between a side (e.g., a top side, another side, etc.) of the cage and an external heat sink. A thermally-conductive and electrically-conductive material is wrapped around at least a portion of the thermal interface material. The thermal interface material and the thermally-conductive and electrically-conductive material define at least a portion of a thermally-conductive heat path between the cage and the external heat sink. The thermally-conductive and electrically-conductive material wrapped around at least a portion of the thermal interface material is operable for electrically grounding the cage.

The thermally-conductive and electrically-conductive material wrapped around at least a portion of the thermal interface material may include at least one of a copper foil, a plated fabric, a nickel-copper plated nylon, a graphite sheet, and a synthetic graphite sheet including a polyethylene terephthalate (PET) layer for increased mechanical and/or abrasion resistance. The thermally-conductive and electrically-conductive material wrapped around at least a portion of the thermal interface material may have a thickness of less than about one hundred micrometers. The thermal interface material may include a ceramic and/or boron nitride filled silicone elastomer. The thermal interface material may include a surface treated such that the thermally-conductive and electrically-conductive material is adherable to silicone elastomer.

In a further exemplary embodiment, a transceiver (broadly, a device) (e.g., small form-factor pluggable (SFP) transceiver, SFP+ transceiver, quad small form-factor pluggable (QSFP) transceiver, QSFP+ transceiver, XFP transceiver, other devices besides transceivers, etc.) includes a cage (broadly, a housing) (e.g., a small form-factor pluggable cage, etc.) adapted to receive a connector (e.g., a small form-factor pluggable cable connector, other cable connector, etc.). A thermal interface material is generally between a side (e.g., a top side, another side, etc.) of the cage and an external heat sink. A thermally-conductive and electrically-conductive material is wrapped around at least a portion of the thermal interface material. At least one spring contact is coupled to the side of the cage generally between the connector and the thermal interface material.

The at least one spring contact, the thermal interface material, and the thermally-conductive and electrically-conductive material may define at least a portion of a thermally-conductive heat path between the connector and the external heat sink. The thermally-conductive and electrically-conductive material wrapped around at least a portion of the thermal interface material may be operable for electrically grounding the cage.

The thermally-conductive and electrically-conductive material wrapped around at least a portion of the thermal interface material may include at least one of a copper foil, a plated fabric, a nickel-copper plated nylon, a graphite sheet, and a synthetic graphite sheet including a polyethylene terephthalate (PET) layer for increased mechanical and/or abrasion resistance.

The transceiver may further comprise a thermoelectric module coupled to the thermal interface material.

The transceiver may further comprise a metal plate coupled to the at least one spring contact. The metal plate may be substantially parallel to the side of the cage and in contact with the connector received in the cage to thereby define a thermally-conductive heat path between the connector and the at least one spring contact. The transceiver may further comprise graphite wrapped generally around at least a portion of the at least one spring contact and the metal plate. The side of the cage may include an opening. The metal plate may be positioned within the opening such that the metal plate and/or the at least one spring contact thereby define at least a portion of the side of the cage.

Also disclosed are methods and assemblies for transferring heat from a heat source such as a connector (e.g., a small form-factor pluggable cable connector, other cable connector, etc.) within a housing or cage (e.g., a small form-factor pluggable cage, etc.), etc. of a device, such as a transceiver (e.g., small form-factor pluggable (SFP) transceiver, SFP+ transceiver, quad small form-factor pluggable (QSFP) transceiver, QSFP+ transceiver, XFP transceiver, other devices besides transceivers, etc.), etc. In an exemplary embodiment, an assembly includes at least one of a thermal interface material and a thermoelectric module and at least one spring contact positionable generally between the connector and the at least one of a thermal interface material and a thermoelectric module. The at least one of a thermal interface material and a thermoelectric module is positionable between the at least one spring contact and an external heat sink for transferring heat from the cage to the external heat sink. The at least one spring contact the thermal interface material and/or a thermoelectric module are operable for defining at least a portion of a thermally-conductive heat path between the connector and the external heat sink.

The at least one spring contact may include at least four spring contacts.

The assembly may further comprise a metal plate coupled to the at least one spring contact. The metal plate may be configured to be substantially parallel to the side of the cage and in contact with the connector received in the cage to thereby define a thermally-conductive heat path between the connector and the at least one spring contact. The assembly may further comprise graphite wrapped generally around at least a portion of the at least one spring contact and the metal plate.

A small form-factor pluggable transceiver (broadly, a device) (e.g., small form-factor pluggable (SFP) transceiver, SFP+ transceiver, quad small form-factor pluggable (QSFP) transceiver, QSFP+ transceiver, XFP transceiver, other devices besides transceivers, etc.) may include the assembly, a small form-factor pluggable cage (broadly, a housing), and a small form-factor pluggable cable connector (broadly, a connector) within the cage. A side (e.g., a top side, another side, etc.) of the cage may include an opening. The metal plate may be positioned within the opening such that the metal plate and/or the at least one spring contact thereby define at least a portion of the side of the cage.

In an exemplary embodiment, the at least one of a thermal interface material and a thermoelectric module is a thermoelectric module.

In another exemplary embodiment, the at least one of a thermal interface material and a thermoelectric module is a thermal interface material. The assembly may further comprise a thermally-conductive and electrically-conductive material wrapped around at least a portion of the thermal interface material for conducting heat from the cage and for electrically grounding the cage. The thermally-conductive and electrically-conductive material wrapped around at least a portion of the thermal interface material may include at least one of a copper foil, a plated fabric, a nickel-copper plated nylon, a graphite sheet, and a synthetic graphite sheet including a polyethylene terephthalate (PET) layer for increased mechanical and/or abrasion resistance. The thermal interface material may include a ceramic and/or boron nitride filled silicone elastomer. The thermal interface material may include a surface treated such that the thermally-conductive and electrically-conductive material adherable to silicone elastomer.

In a further exemplary embodiment, an assembly includes a thermal interface material positionable generally between a side (e.g., a top side, another side, etc.) of the cage and an external heat sink. A thermally-conductive and electrically-conductive material is wrapped around at least a portion of the thermal interface material. The thermal interface material and the thermally-conductive and electrically-conductive material are operable for defining at least a portion of a thermally-conductive heat path between the cage and the external heat sink. The thermally-conductive and electrically-conductive material wrapped around at least a portion of the thermal interface material is operable for electrically grounding the cage.

The thermally-conductive and electrically-conductive material wrapped around at least a portion of the thermal interface material may include at least one of a copper foil, a plated fabric, a nickel-copper plated nylon, a graphite sheet, and a synthetic graphite sheet including a polyethylene terephthalate (PET) layer for increased mechanical and/or abrasion resistance.

The thermally-conductive and electrically-conductive material wrapped around at least a portion of the thermal interface material may have a thickness of less than about one hundred micrometers.

The thermal interface material may include a ceramic and/or boron nitride filled silicone elastomer. The thermal interface material may include a surface treated such that the thermally-conductive and electrically-conductive material adherable to silicone elastomer.

A small form-factor pluggable transceiver (broadly, a device) (e.g., small form-factor pluggable (SFP) transceiver, SFP+ transceiver, quad small form-factor pluggable (QSFP) transceiver, QSFP+ transceiver, XFP transceiver, other devices besides transceivers, etc.) may include the assembly, a small form-factor pluggable cage (broadly, a housing), and a small form-factor pluggable cable connector (broadly, a connector) within the cage. The thermal interface material and the thermally-conductive and electrically-conductive material may define a thermally-conductive heat path between the cage and an external heat sink. The thermally-conductive and electrically-conductive material wrapped around at least a portion of the thermal interface material may electrically ground the cage.

In exemplary embodiments that include one or more graphite sheets, the graphite sheet(s) may include one or more Tgon™ 9000 series graphite sheets. Tgon™ 9000 series graphite sheets comprise synthetic graphite thermal interface materials having a carbon in-plane mono-crystal structure and that are ultra-thin, light-weight, flexible and offer excellent in-plane thermal conductivity. Tgon™ 9000 series graphite sheets are useful for a variety of heat spreading applications where in-plane thermal conductivity dominates and in limited spaces. Tgon™ 9000 series graphite sheets may have a thermal conductivity from about 500 to about 1900 W/mK, may help reduce hot spots and protect sensitive areas, may enable slim device designs due to the ultra-thin sheet thickness of about 17 micrometers to 25 micrometers, may be bight weight with density from about 2.05 g/cm³ to 2.25 g/cm³, may be flexible and able to withstand more than 10,000 times bending with radius of 5 millimeters. Table 1 below includes addition details about Tgon™ 9000 series graphite sheets.

TABLE 1

| Product Name | | Test Method | Tgon 9017 | Tgon 9025 | Tgon 9040 | Tgon 9070 | Tgon 9100 |
| --- | --- | --- | --- | --- | --- | --- | --- |
| Thickness (mm) | | ASTM D374 | 0.017 +/− 0.005 | 0.025 +/− 0.005 | 0.04 +/− 0.005 | 0.07 +/− 0.01 | 0.1 +/− 0.01 |
| Thermal conductivity (W/mK) | X,Y direction | ASTM E1461 | 1650~1900 | 1500~1700 | 1150~1400 | 700~1000 | 500~700 |
| | Z direction | | 15 | 15 | 15 | 15 | 15 |
| Thermal diffusivity (cm²/s) | | ASTM E1461 | 9 | 9 | 8 | 7 | 7 |
| Density (g/cm³) | | ASTM D792 | 2.05~2.25 | 2.05~2.25 | 1.65~1.85 | 1.0~1.3 | 0.7~1.0 |
| Specific heat (50° C.)(J/gK) | | ASTM E1269 | 0.85 | 0.85 | 0.85 | 0.85 | 0.85 |
| Heat resistance (° C.) | | Over 100 hours of testing | 400 | 400 | 400 | 400 | 400 |
| Extensional strength (MPa) | X,Y direction | ASTM F152 | 39 | 28 | 23 | 20 | 19.2 |
| | Z direction | | 0.1 | 0.4 | 0.4 | 0.4 | 0.65 |
| Bending test(times) (RS/180°) | | ASTM D2176 | 10,000 or more | 10,000 or more | 10,000 or more | 10,000 or more | 10,000 or more |
| Electric conductivity (S/cm) | | ASTM E1269 | 20000 | 20000 | 20000 | 96000 | 96000 |

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific numerical dimensions and values, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (the disclosure of a first value and a second value for a given parameter may be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "has," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A device comprising:
   a housing comprising a cage adapted to receive a connector;
   an external heat sink;

at least one of a thermal interface material and a thermoelectric module between a side of the cage and the external heat sink; and at least one spring contact coupled to the side of the cage between the connector and the at least one of a thermal interface material and a thermoelectric module;

whereby the at least one spring contact and the at least one of a thermal interface material and a thermoelectric module define at least a portion of a thermally-conductive heat path between the connector and the external heat sink;

wherein the device further comprises a plate coupled to the at least one spring contact, the plate substantially parallel to the side of the cage and in contact with the connector received in the cage to thereby define a thermally-conductive heat path between the connector and the at least one spring contact.

2. The device of claim 1, wherein:
the device is a small form-factor pluggable transceiver;
the connector is a small form-factor pluggable cable connector; and
the cage is a small form-factor pluggable cage adapted to receive the small form-factor pluggable cable connector.

3. The device of claim 1, wherein the at least one spring contact includes at least four spring contacts each coupled to the side of the cage between the connector and the at least one of a thermal interface material and a thermoelectric module.

4. The device of claim 1, further comprising graphite wrapped around at least a portion of the at least one spring contact and the plate.

5. The device of claim 1, wherein:
the side of the cage includes an opening; and
the plate is positioned within the opening such that at least one of the plate and the at least one spring contact thereby define at least a portion of the side of the cage.

6. The device of claim 1, wherein the plate comprises at least a first plate and second plate, and wherein:
the at least one spring contact includes at least a first spring contact coupled to the first plate and a second spring contact coupled to the second plate;
a first graphite sheet is wrapped around at least a portion of the first spring contact and the first plate, whereby the first graphite sheet defines a first thermally-conductive heat path around the at least a portion of the first spring contact and the first plate; and
a second graphite sheet is wrapped around at least a portion of the second spring contact and the second plate, whereby the second graphite sheet defines a second thermally-conductive heat path around the at least a portion of the second spring contact and the second plate.

7. The device of claim 1, wherein:
the device further comprises a label disposed on the housing, the label comprising graphite and including indicia related to the device; or
the at least one spring contact is coupled to the side of the housing via a laser weld.

8. The device of claim 1, further comprising:
a thermally-conductive and electrically-conductive material wrapped around at least a portion of the at least one of a thermal interface material and a thermoelectric module for conducting heat from the housing and for electrically grounding the housing, wherein:
the thermally-conductive and electrically-conductive material wrapped around the at least a portion of the at least one of a thermal interface material and a thermoelectric module includes at least one of a copper foil, a plated fabric, a nickel-copper plated nylon, a graphite sheet, and a synthetic graphite sheet including a polyethylene terephthalate (PET) layer for at least one increased mechanical resistance and increased abrasion resistance.

9. The device of claim 1, further comprising:
a thermally-conductive and electrically-conductive material wrapped around at least a portion of the at least one of a thermal interface material and a thermoelectric module;
whereby the at least one of a thermal interface material and a thermoelectric module and the thermally-conductive and electrically-conductive material define at least a portion of a thermally-conductive heat path between the housing and the external heat sink, and the thermally-conductive and electrically-conductive material wrapped around the at least a portion of the at least one of a thermal interface material and a thermoelectric module is operable for electrically grounding the housing.

10. A device comprising:
a housing;
an external heat sink;
a thermal interface material between a side of the housing and the external heat sink;
at least one spring contact coupled to the side of the housing between the housing and the thermal interface material, whereby the at least one spring contact and the thermal interface material define at least a portion of a thermally-conductive heat path between the housing and the external heat sink; and
a thermally-conductive and electrically-conductive material wrapped around at least a portion of the thermal interface material for conducting heat from the housing and for electrically grounding the housing,
wherein:
the thermally-conductive and electrically-conductive material wrapped around the at least a portion of the thermal interface material includes at least one of a copper foil, a plated fabric, a nickel-copper plated nylon, a graphite sheet, and a synthetic graphite sheet including a polyethylene terephthalate (PET) layer for at least one increased mechanical resistance and increased abrasion resistance;
the housing comprises a cage adapted to receive a connector;
the at least one of a thermal interface material and a thermoelectric module is between a side of the cage and the external heat sink; and
the at least one spring contact is coupled to the side of the cage generally between the connector and the at least one of a thermal interface material and a thermoelectric module;
the at least one spring contact and the at least one of a thermal interface material and a thermoelectric module define at least a portion of a thermally-conductive heat path between the connector and the external heat sink.

11. The device of claim 10, further comprising a plate coupled to the at least one spring contact, the plate substantially parallel to the side of the cage and in contact with the connector received in the cage to thereby define a thermally-conductive heat path between the connector and the at least one spring contact.

12. A device comprising:
a housing;
an external heat sink;
a thermal interface material between a side of the housing and the external heat sink; and
a thermally-conductive and electrically-conductive material wrapped around at least a portion of the thermal interface material;
whereby the thermal interface material and the thermally-conductive and electrically-conductive material define at least a portion of a thermally-conductive heat path between the housing and the external heat sink, and the thermally-conductive and electrically-conductive material wrapped around the at least a portion of the thermal interface material is operable for electrically grounding the housing;
wherein the device further comprises:
at least a first plate and a second plate;
at least a first spring contact coupled to the first plate and a second spring contact coupled to the second plate;
a first graphite sheet wrapped around at least a portion of the first spring contact and the first plate, whereby the first graphite sheet defines a first thermally-conductive heat path around the at least a portion of the first spring contact and the first plate; and
a second graphite sheet wrapped around at least a portion of the second spring contact and the second plate, whereby the second graphite sheet defines a second thermally-conductive heat path around the at least a portion of the second spring contact and the second plate.

13. The device of claim 12, wherein:
the housing comprises a cage adapted to receive a connector;
the thermal interface material is between a side of the cage and the external heat sink; and
the thermal interface material and the thermally-conductive and electrically-conductive material define at least a portion of a thermally-conductive heat path between the cage and the external heat sink, and the thermally-conductive and electrically-conductive material wrapped around the at least a portion of the thermal interface material is operable for electrically grounding the cage.

14. The device of claim 13, wherein:
the device is a small form-factor pluggable transceiver;
the connector is a small form-factor pluggable cable connector; and
the cage is a small form-factor pluggable cage adapted to receive the small form-factor pluggable cable connector.

15. A device comprising:
a housing;
an external heat sink;
a thermal interface material between a side of the housing and the external heat sink; and
a thermally-conductive and electrically-conductive material wrapped around at least a portion of the thermal interface material;
whereby the thermal interface material and the thermally-conductive and electrically-conductive material define at least a portion of a thermally-conductive heat path between the housing and the external heat sink, and the thermally-conductive and electrically-conductive material wrapped around the at least a portion of the thermal interface material is operable for electrically grounding the housing;
wherein:
the device further comprises a thermoelectric module coupled to the thermal interface material; and
the housing comprises a cage adapted to receive a connector; and further comprising at least one spring contact coupled to the side of the cage between the connector and the thermal interface material, wherein the at least one spring contact, the thermal interface material, and the thermally-conductive and electrically-conductive material define at least a portion of a thermally-conductive heat path between the connector and the external heat sink.

16. The device of claim 15,
wherein the thermally-conductive and electrically-conductive material wrapped around the at least a portion of the thermal interface material includes at least one of a copper foil, a plated fabric, a nickel-copper plated nylon, a graphite sheet, and a synthetic graphite sheet including a polyethylene terephthalate (PET) layer for at least one of increased mechanical resistance and increased abrasion resistance.

17. A device comprising:
a housing comprising a cage adapted to receive a connector;
an external heat sink;
a thermal interface material between a side of the cage and the external heat sink;
a thermally-conductive and electrically-conductive material wrapped around at least a portion of the thermal interface material;
whereby the thermal interface material and the thermally-conductive and electrically-conductive material define at least a portion of a thermally-conductive heat path between the cage and the external heat sink, and the thermally-conductive and electrically-conductive material wrapped around the at least a portion of the thermal interface material is operable for electrically grounding the cage; and
wherein the device further comprises:
at least one spring contact coupled to the side of the cage between the connector and the thermal interface material, wherein the at least one spring contact, the thermal interface material, and the thermally-conductive and electrically-conductive material define at least a portion of a thermally-conductive heat path between the connector and the external heat sink; and
a plate coupled to the at least one spring contact, the plate substantially parallel to the side of the cage and in contact with the connector received in the cage to thereby define a thermally-conductive heat path between the connector and the at least one spring contact.

18. The device of claim 17, further comprising graphite wrapped around at least a portion of the at least one spring contact and the plate.

19. The device of claim 17, wherein:
the side of the cage includes an opening; and
the plate is positioned within the opening such that at least one of the plate and the at least one spring contact thereby define at least a portion of the side of the cage.

20. A device comprising:
a housing;
an external heat sink;
a thermal interface material between a side of the housing and the external heat sink; and
a thermally-conductive and electrically-conductive material wrapped around at least a portion of the thermal interface material;
whereby the thermal interface material and the thermally-conductive and electrically-conductive material define at least a portion of a thermally-conductive heat path between the housing and the external heat sink, and the thermally-conductive and electrically-conductive material wrapped around the at least a portion of the thermal interface material is operable for electrically grounding the housing;
wherein the device further comprises:
  a thermoelectric module coupled to the thermal interface material;
  at least a first plate and a second plate;
  at least a first spring contact coupled to the first plate and a second spring contact coupled to the second plate;
  a first graphite sheet wrapped around at least a portion of the first spring contact and the first plate, whereby the first graphite sheet defines a first thermally-conductive heat path around the at least a portion of the first spring contact and the first plate; and
  a second graphite sheet wrapped around at least a portion of the second spring contact and the second plate, whereby the second graphite sheet defines a second thermally-conductive heat path around the at least a portion of the second spring contact and the second plate.

21. An assembly for transferring heat from a device having a housing adapted to receive a connector, the assembly comprising:
  at least one of a thermal interface material and a thermoelectric module, at least one spring contact positionable between the housing and the at least one of a thermal interface material and a thermoelectric module, the at least one of a thermal interface material and a thermoelectric module is positionable between the at least one spring contact and an external heat sink for transferring heat from the housing to the external heat sink, whereby the at least one spring contact and the at least one of a thermal interface material and a thermoelectric module are operable for defining at least a portion of a thermally-conductive heat path between the housing and the external heat sink, wherein the assembly further comprises a plate coupled to the at least one spring contact, the plate substantially parallel to the side of the housing and in contact with the connector received in the housing to thereby define a thermally-conductive heat path between the connector and the at least one spring contact; or
  a thermal interface material positionable between the housing and an external heat sink, and a thermally-conductive and electrically-conductive material wrapped around at least a portion of the thermal interface material, whereby the thermal interface material and the thermally-conductive and electrically-conductive material are operable for defining at least a portion of a thermally-conductive heat path between the housing and the external heat sink, and the thermally-conductive and electrically-conductive material wrapped around the at least a portion of the thermal interface material is operable for electrically grounding the housing; wherein the thermally-conductive and electrically-conductive material wrapped around the at least a portion of the thermal interface material includes at least one of a copper foil, a plated fabric, a nickel-copper plated nylon, a graphite sheet, and a synthetic graphite sheet including a polyethylene terephthalate (PET) layer for at least one of increased mechanical resistance and increased abrasion resistance.

22. The assembly of claim 21, wherein the housing comprises a cage adapted to receive the connector.

23. The assembly of claim 22, wherein:
the device is a small form-factor pluggable transceiver;
the connector is a small form-factor pluggable cable connector; and
the cage is a small form-factor pluggable cage adapted to receive the small form-factor pluggable cable connector.

* * * * *